United States Patent
Mitra et al.

(10) Patent No.: US 6,232,153 B1
(45) Date of Patent: May 15, 2001

(54) PLASTIC PACKAGE ASSEMBLY METHOD FOR A FERROELECTRIC-BASED INTEGRATED CIRCUIT

(75) Inventors: Sanjay Mitra, Colorado Springs, CO (US); Vic Lau, Chaun Park (SG)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/090,575

(22) Filed: Jun. 4, 1998

(51) Int. Cl.[7] .......................... H01L 21/44; H01L 21/48; H01L 21/50; H01L 21/00
(52) U.S. Cl. ............................... 438/127; 438/3; 438/112
(58) Field of Search ......................... 438/106, 119, 438/112, 127, 3; 101/487

(56) References Cited

U.S. PATENT DOCUMENTS

| | | | |
|---|---|---|---|
| 4,063,349 | * 12/1977 | Passler et al. | 29/627 |
| 4,175,973 | * 11/1979 | Crivello | 204/159.14 |
| 4,398,457 | * 8/1983 | Takahashi et al. | 101/44 |
| 4,595,647 | * 6/1986 | Spanjer | 430/138 |
| 4,655,134 | * 4/1987 | Chen | 101/426 |
| 4,908,935 | * 3/1990 | Blumenstock | 29/827 |
| 4,910,581 | * 3/1990 | Baird | 357/72 |
| 4,987,673 | * 1/1991 | Kogura et al. | 29/564 |
| 5,439,849 | * 8/1995 | McBride et al. | 437/219 |
| 5,634,267 | * 6/1997 | Farnworth et al. | 29/840 |
| 5,644,158 | * 7/1997 | Fujii et al. | 257/532 |
| 5,776,278 | * 7/1998 | Tuttle et al. | 156/213 |
| 5,943,557 | * 8/1999 | Moden | 438/118 |
| 6,057,175 | * 5/2000 | Milla et al. | 438/113 |

OTHER PUBLICATIONS

D. White, et al, "Optimization of Plastic Packaging of Ferroelectric Semiconductor Memories", presented at 10th Anniversary International Symposium on Integrated Ferroelectrics, Monterey, California, Mar. 2, 1998.

E. Philofsky, Ph.D., et al., "A Qualitative Model for Degradation Of FRAM® Products During Plastic Packaging", presented at 10th Anniversary International Symposium on Integrated Ferroelectrics, Monterey, California, Mar. 2, 1998.

* cited by examiner

Primary Examiner—Richard Elms
Assistant Examiner—Adam Pyonin
(74) Attorney, Agent, or Firm—Peter J. Meza, Esq.; Carol W. Burton, Esq.

(57) ABSTRACT

A plastic package assembly method suitable for ferroelectric-based integrated circuits includes a strict thermal budget that reduces the time at temperature for four key processing steps: die attach cures, die coat cures, molding cures, and marking cures. The plastic package assembly method uses low temperature mold and die coat materials, as well as low temperature curable inks or laser marking in order to minimize degradation of electrical performance, thus improving yields and reliability. The assembly method uses a snap cure die attach step, a die coat followed by a room temperature cure, and formation of the plastic package with room temperature curable molding compounds not requiring a post mold cure. Front and back marking of the plastic package is accomplished using either an infrared or ultraviolet curable ink followed by minimum cure time at elevated temperature, or by using laser marking.

12 Claims, 8 Drawing Sheets

PLASTIC PACKAGE ASSEMBLY METHOD FOR A FERROELECTRIC-BASED INTEGRATED CIRCUIT

BACKGROUND OF THE INVENTION

This invention relates generally to a plastic package assembly method, and more particularly to a "ferroelectric friendly" plastic package assembly method suitable for improving the retention performance and reliability of ferroelectric memory circuits.

Ferroelectric memory products generally exhibit poor performance in plastic packages as compared to other packaging options such as ceramic packages. One of the chief causes of the poor performance is the elevated temperatures that the ferroelectric integrated circuit is exposed to for extended times during plastic package assembly. Typically, combined cures performed during plastic package assembly of ferroelectric memories can be as long as ten hours at temperatures that can activate undesirable imprint mechanisms as these temperatures approach the Curie point of the ferroelectric dielectric material used. Current assembly methods use ink cures, wafer mount cures, die attach cures, wire bonding, die coat cures, molding, molding cures, as well as back and top marking cures. Each of these processing steps contribute to the time spent at an elevated temperature, which can adversely affect electrical performance.

Figure 1:
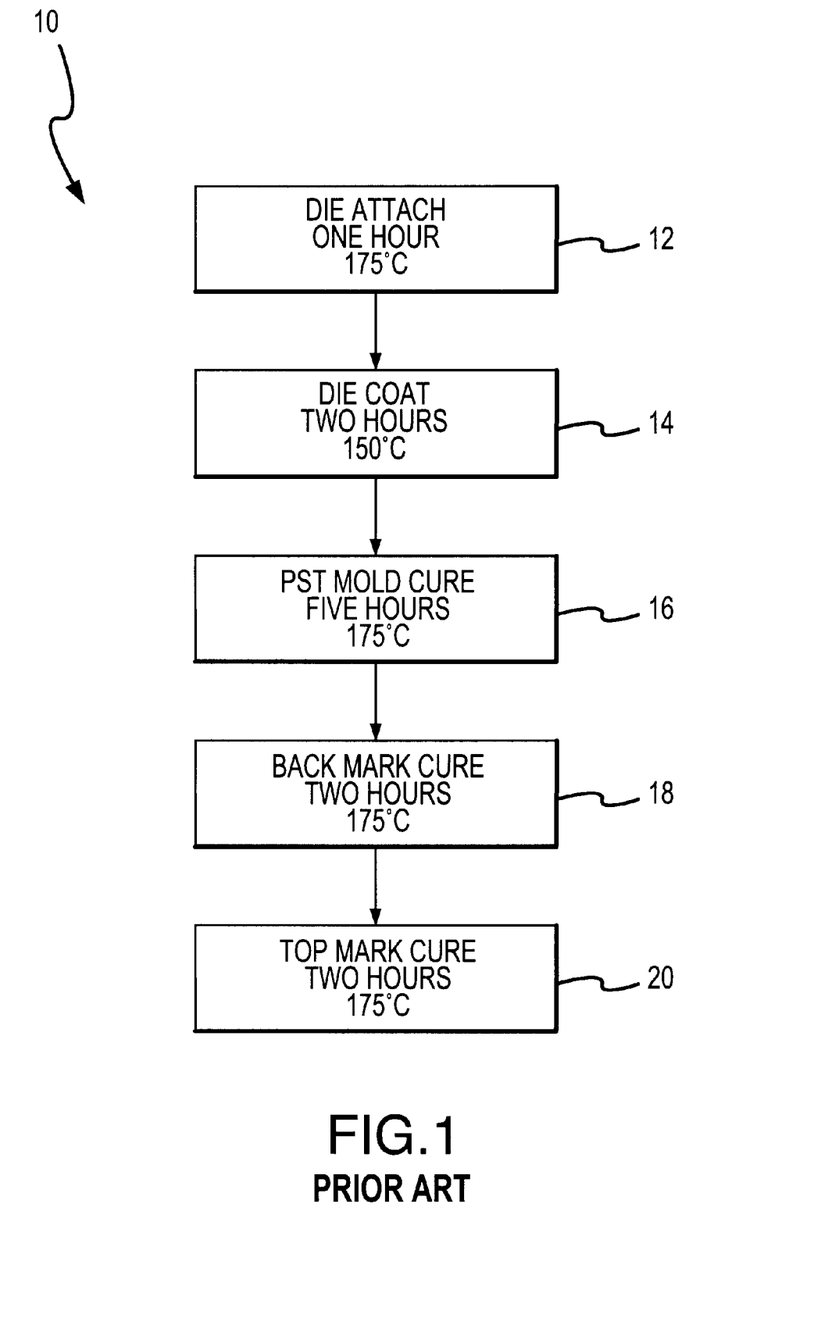
FIG. 1 is a flow chart of a prior art plastic packaging assembly method that is suitable for silicon-based integrated circuits, but unsuitable for obtaining maximum yield and reliability in ferroelectric-based integrated circuits due to an undesirable exposure to elevated temperatures for extended periods of time.

A typical prior art plastic package assembly flow 10 is shown in FIG. 1. Note that not every plastic package assembly step is shown in FIG. 1, only those steps having a significant "time at temperature" exposure, and that are significantly altered in the plastic packaging method of the present invention, which is described in further detail below.

A typical die attach step 12 is referenced in FIG. 1, which is usually performed at a temperature of 175° C. or more for at least an hour. A typical die coat and curing step 14 is referenced in FIG. 1, which is usually performed at a temperature of 150° C. or more for at least two hours. After the plastic package is formed during a molding step, a typical post mold curing step 16 is referenced in FIG. 1, which can be performed at a temperature of 175° C. or more for at least five hours. After the package is inked, a typical back mark curing step 18 is referenced in FIG. 1, which can be performed at a temperature of 175° C. or more for at least two hours. A typical front or top mark curing step 20 is referenced in FIG. 1, which can be performed at a temperature of 175° C. or more for at least two hours.

Figure 2:
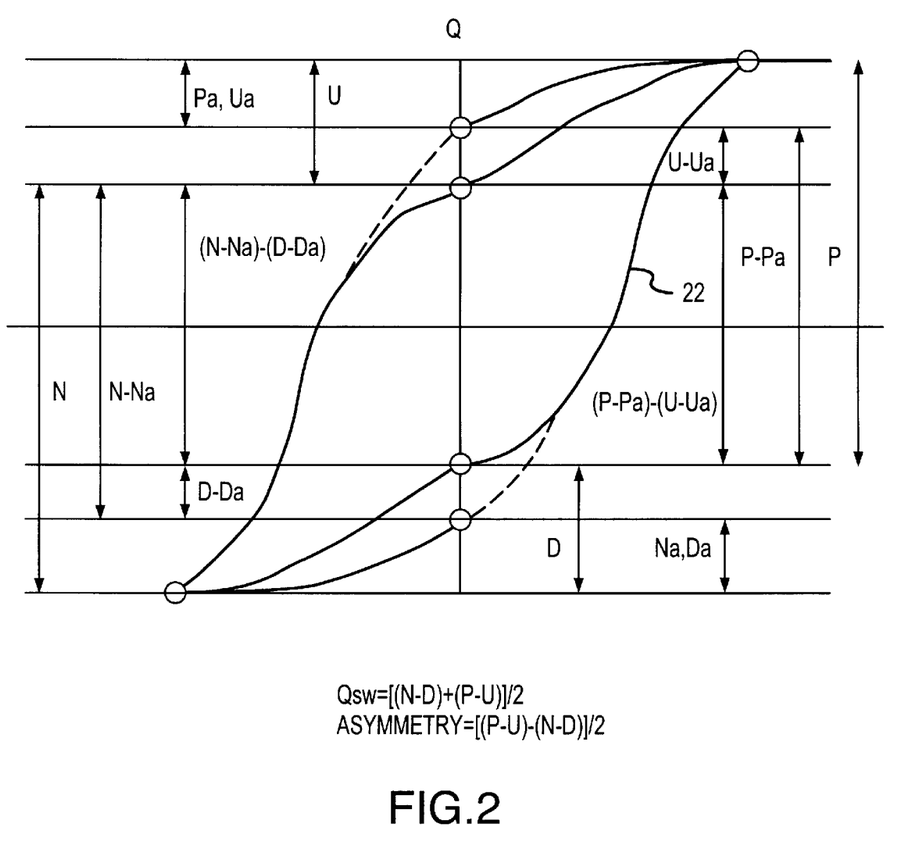
FIG. 2 is a hysteresis loop diagram associated with a ferroelectric capacitor or dielectric material particularly including reference to the P, U, N, and D charge components, switched charge, and asymmetry terms.

The adverse effects of time spent at temperature for ferroelectric devices can be further analyzed with respect to a hysteresis loop, which is a representation of the charge versus voltage characteristics of a ferroelectric device. A typical hysteresis loop 22 for a ferroelectric capacitor is shown in FIG. 2. The size and shape of hysteresis loop 22 can be used to characterize the electrical performance of a ferroelectric capacitor, and can also be used to diagnose the degradation of electrical performance due to exposure at elevated temperatures for extended times. Data retention reliability can be adversely affected by changes in the ferroelectric capacitor due to exposure of the integrated circuit at elevated temperatures for extended times. Switched charge ($Q_{sw}$) loss due to thermal depolarization at elevated temperatures approaching, but not exceeding, the Curie point affect the retention performance of the completely fabricated, plastic packaged ferroelectric memory. Asymmetry, which is the undesirable shift in hysteresis loop 22 along the voltage (X) axis, is also impacted as a result of extended times at elevated temperatures. With reference to the P, U, N, and D charge components associated with hysteresis loop 22 of FIG. 2, switched charge and asymmetry are defined as follows:

$$Q_{sw}=((N-D)+(P-U))/2 \quad [1]$$

$$\text{Asymmetry}=((P-U)-(N-D))/2 \quad [2]$$

Asymmetry and loss of switched charge are linked and are both adversely affected by conventional plastic package assembly methods that are otherwise suitable for non-ferroelectric based integrated circuits.

What is desired, therefore, is a plastic package assembly method that greatly reduces the undesirable impact on electrical performance of a ferroelectric integrated circuit due to loss in switched charge and increased asymmetry due to exposure to elevated temperatures for extended periods of time.

SUMMARY OF THE INVENTION

It is, therefore, a principal object of the present invention to maximize the yield and reliability of ferroelectric integrated circuit memories and other ferroelectric-based integrated circuits during and subsequent to plastic packaging.

According to the present invention, a "ferroelectric friendly" plastic package assembly method includes a strict thermal budget that reduces the time at temperature for four key processing steps: die attach cures, die coat cures, molding cures, and marking cures, while still providing a suitable plastic package for a ferroelectric-based integrated circuit. The plastic package assembly method of the present invention uses low temperature mold and die coat materials, as well as low temperature curable inks or laser marking in order to minimize degradation of electrical performance, thus improving manufacturing yields and reliability.

In part, the method of the present invention uses a snap cure die attach step, a die coat followed by a room temperature cure, and forming the plastic package with room temperature curable molding compounds not requiring a post mold cure. Top and back marking of the plastic package is accomplished using an infrared ink followed by minimum cure time at elevated temperature, by using laser marking, or by using ultraviolet curable ink.

The foregoing and other objects, features and advantages of the invention will become more readily apparent from the following detailed description of a preferred embodiment of the invention which proceeds with reference to the accompanying drawings.

DETAILED DESCRIPTION

Figure 3:
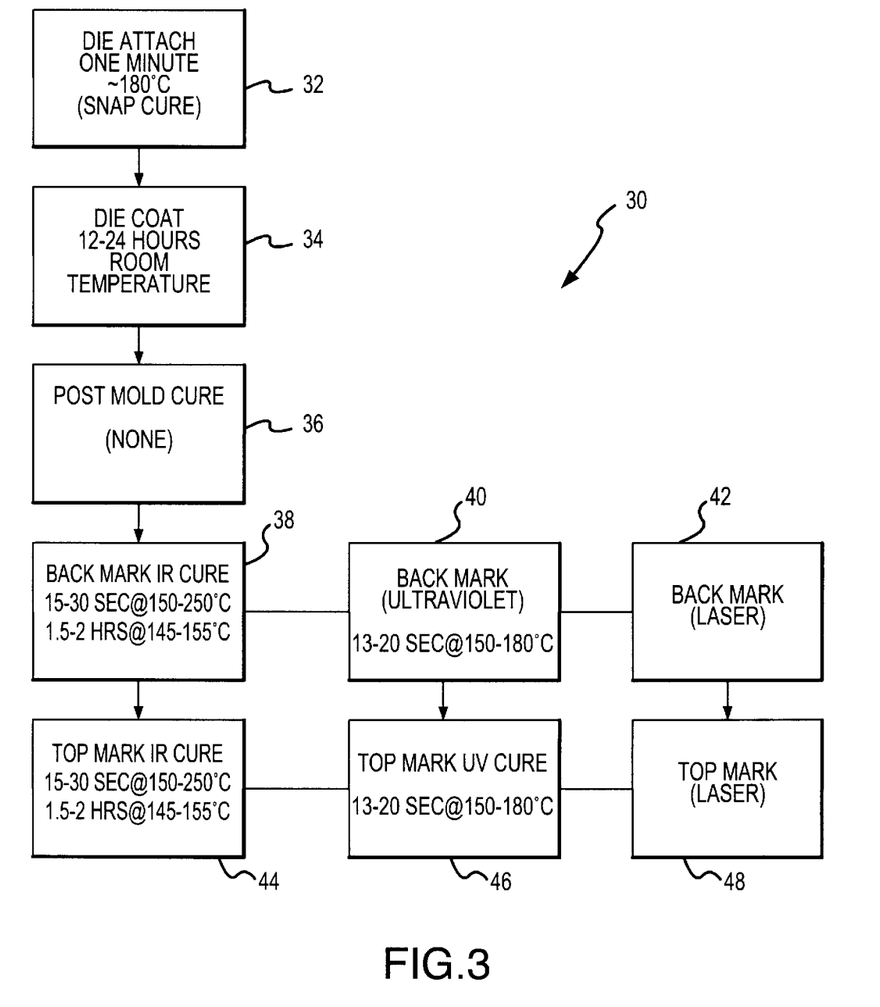
FIG. 3 is a flow chart of a plastic packing assembly method for improving the yield and reliability of ferroelectric-based integrated circuits according to the present invention, including infrared or ultraviolet ink cures, or laser marking options.

Referring now to FIG. 3, a "ferroelectric friendly" plastic package flow 30 is shown according to the present invention. It is important to note that not all of the many manufacturing steps commonly found in plastic packing are shown in the flow chart of FIG. 3. Steps like die bonding and inking of the tested integrated circuits at the wafer level are well known to those skilled in the art and need not be unnecessarily repeated. Further, the time and temperature profile of these many steps are not especially damaging to the electrical performance of the ferroelectric memory or integrated circuit and therefore these steps are not materially altered according to the method of the present invention. Only those steps shown and described in further detail with respect to FIG. 3 have been materially altered in order to change the time and temperature profile.

It is also important to note that in the plastic packaging method described below, no hydrogen should be present during any of the assembly processing steps.

Referring to FIG. 3, the first step 32 is the die attach step in which the integrated circuit die such as a ferroelectric memory chip is attached to a conventional lead frame. Die attach step 32 is performed using a "snap cure" in which the die attach compound is instantly cured by a momentary exposure (one minute or less) to an elevated temperature. The snap cure used in the method of the present invention is done using a seven zone tunnel die attach heater block set at temperatures of 170, 180, 200, 200, 200, 190, and 180° C. The units pass through the tunnel via a conveyer belt and take a total of about one minute to pass through the tunnel. The die attach compound used is a gold-filled epoxy such as compound CRM-1064 manufactured by the Sumitomo Co., Ltd. of Osaka, Japan.

Figure 4:
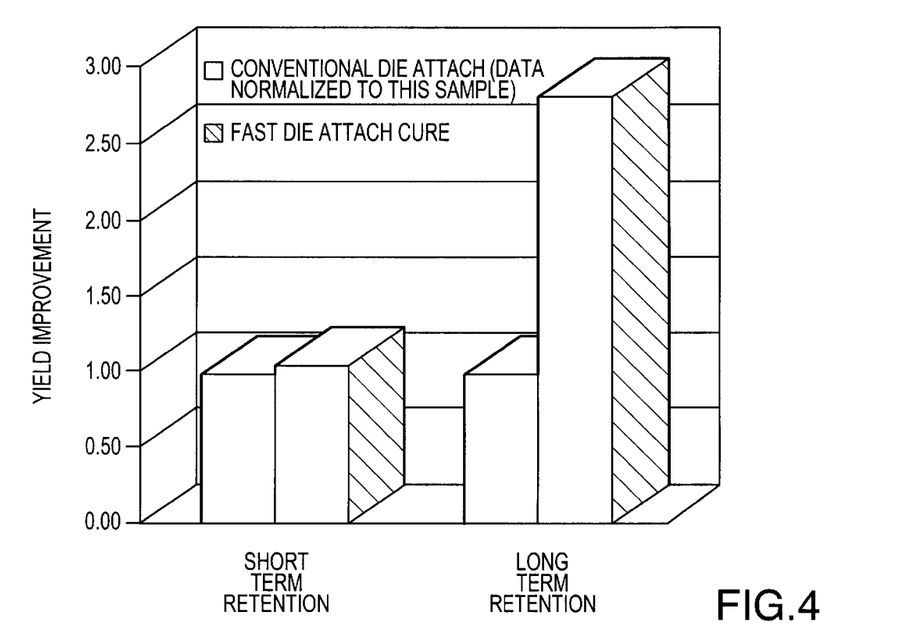
FIG. 4 is a yield improvement chart for the die attach step used in the method of the present invention.

Referring now to FIG. 4, the yield improvement results at the die attach step 32 (with respect to the conventional die attach described above in the Background of the Invention) for both short term and long term memory retention are shown. Short term memory retention is defined as maintaining a memory state for four hours at 150° C. Short term memory retention testing is a retention test typically conducted during production testing to screen out infant failures. Long term memory retention is defined as maintaining a memory state for 72 hours at 150° C. Long term memory retention testing is a retention test used to measure the median lifetime of the product under test and is an indicator of long term reliability in terms of data retention. Referring again to FIG. 4, while short term memory retention is only marginally improved, long term retention is improved by a factor of about 2.8.

Figure 5:
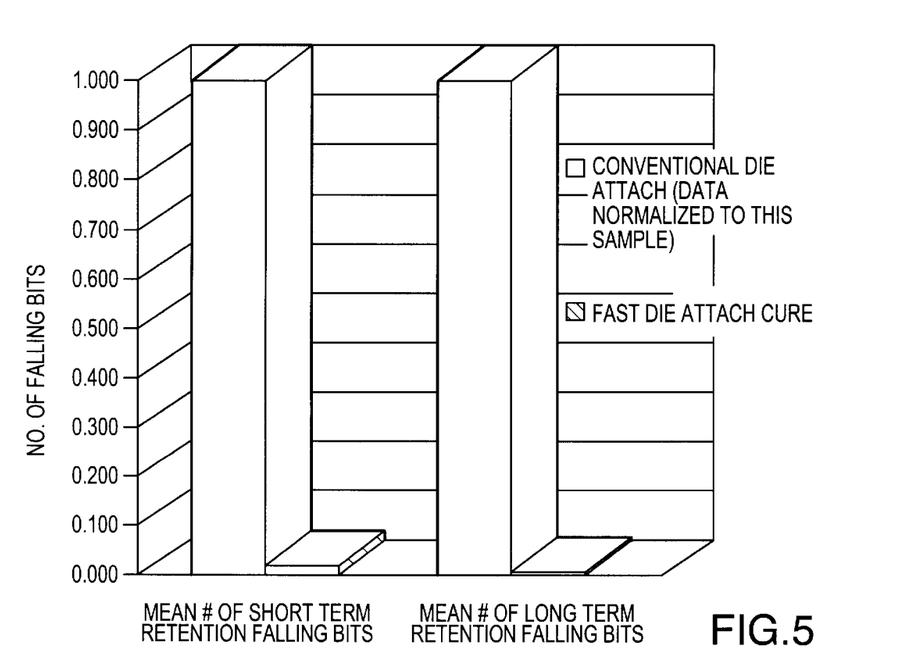
FIG. 5 is a "failed bits" chart for the die attach step used in the method of the present invention.

Referring now to FIG. 5, the number of failing bits at die attach step 32 (with respect to the conventional die attach described above in the Background of the Invention) due to failure of both short term and long term memory retention are shown. The mean number of failing bits is the total number of bits that failed to retain data divided by the total number of failing parts. The mean number of failing bits is an indicator of the robustness of the memory device under test. Referring again to FIG. 5, the number of failing bits for short term retention was reduced by a factor of 51, while the number of failing bits for long term retention was reduced by a factor of 326.

Referring again to FIG. 3, the second step 34 is the die coating and curing step in which the ferroelectric integrated circuit die, which is attached to the lead frame, is conformally coated with a suitable die coating material. The die coating step 32 is performed at room temperature. The coated die is cured at room temperature, with typical curing times ranging between 12 and 24 hours, although other curing times can be used depending upon the die coating material selected. The die coating material used is a soft transparent silicone encapsulant such as coating material Hipec Q3-6633 manufactured by the Dow Corning Corporation of Midland, Mich. Silicone-based coating materials should be mixed in two-to-one or other ratios as specified by the vendor.

Figure 6:
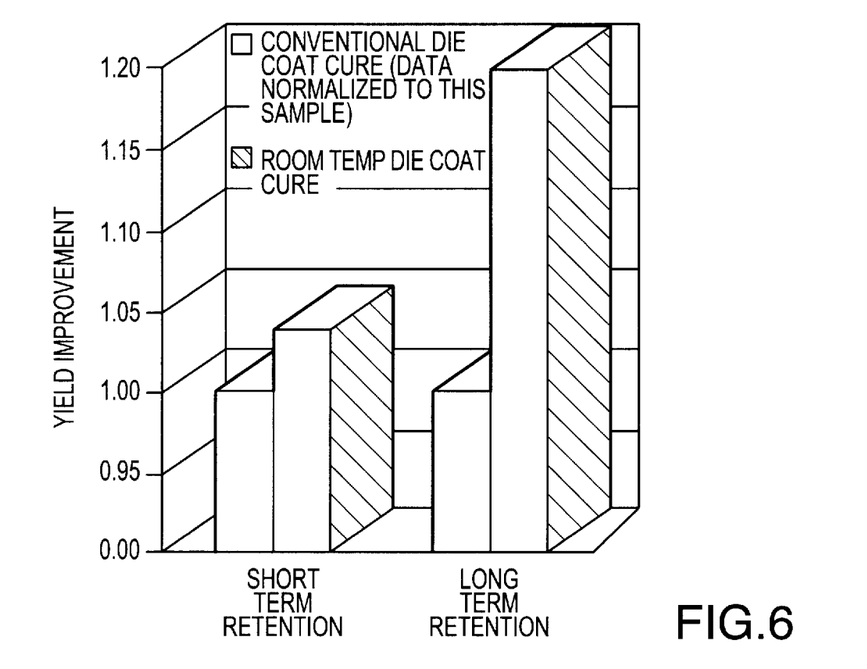
FIG. 6 is a yield improvement chart for the die coat cure step used in the method of the present invention.

Referring now to FIG. 6, the yield improvement results at the die coating and curing step 34 for both short term and long term memory retention are shown. Once again, short term memory retention only marginally improved, but long term retention improved by a factor of about 1.2.

Figure 7:
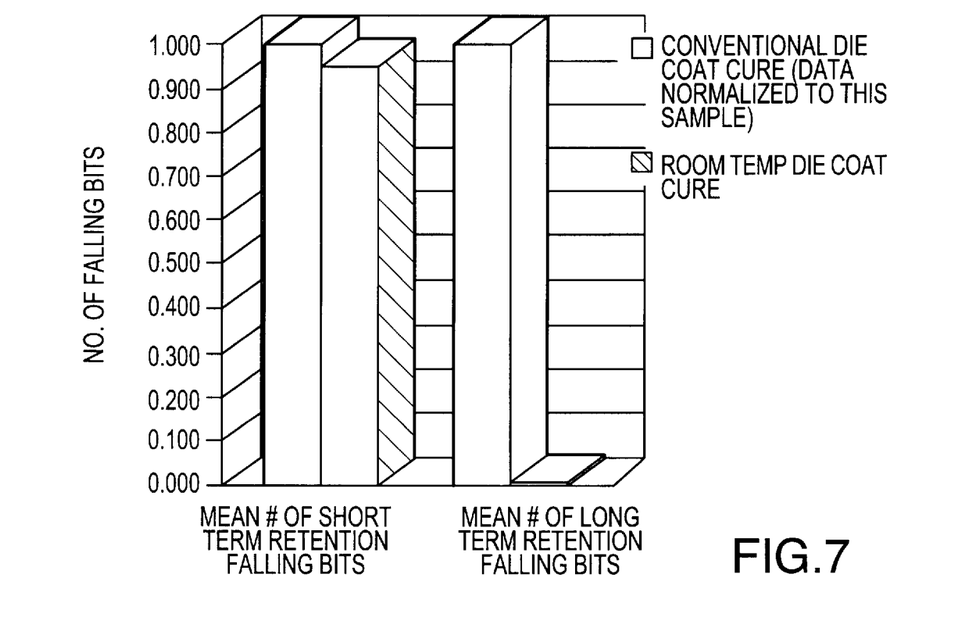
FIG. 7 is a "failed bits" chart for the die coat cure step used in the method of the present invention.

Referring now to FIG. 7, the number of failing bits at the die coating and curing step 34 due to failure of both short term and long term memory retention are shown. The number of failing bits for short term retention was only marginally reduced, while the number of failing bits for long term retention was reduced by a factor of 429.

Referring again to FIG. 3, in forming the plastic package, a room temperature molding compound is used that does not require a separate postmold curing step. In other words, the plastic package is complete and essentially ready for further processing steps as it is released from the mold. The total time at temperature inside of the mold required to form the plastic package is about one minute at 175° C. A block 36 referencing the lack of a separate post mold cure at elevated temperatures is shown in FIG. 3. The molding compound used is a plastic epoxy such as molding compound 6600R manufactured by the Sumitomo Co., Ltd. of Osaka, Japan.

Figure 8:
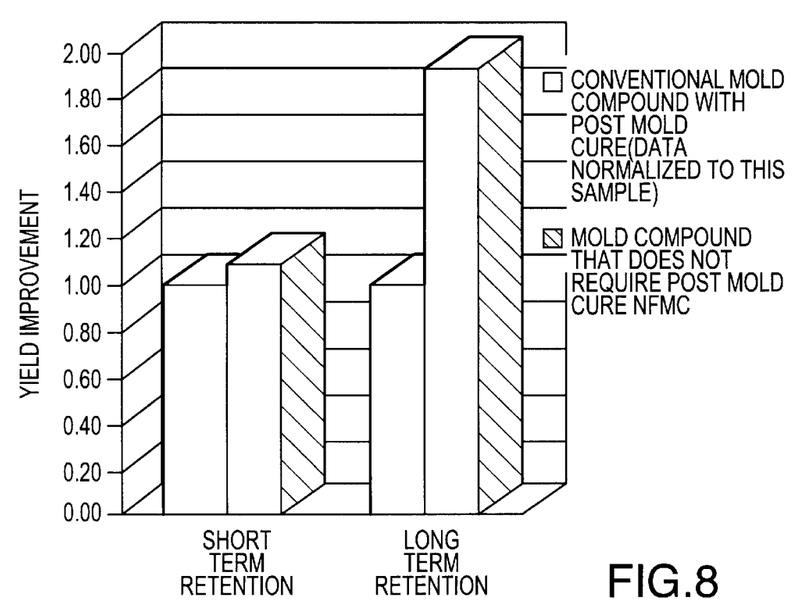
FIG. 8 is a yield improvement chart for the mold compound step used in the method of the present invention.

Referring now to FIG. 8, the yield improvement results after the molding step for both short term and long term memory retention are shown. Once again, short term memory retention only marginally improved, but long term retention improved by a factor of about 1.9.

Figure 9:
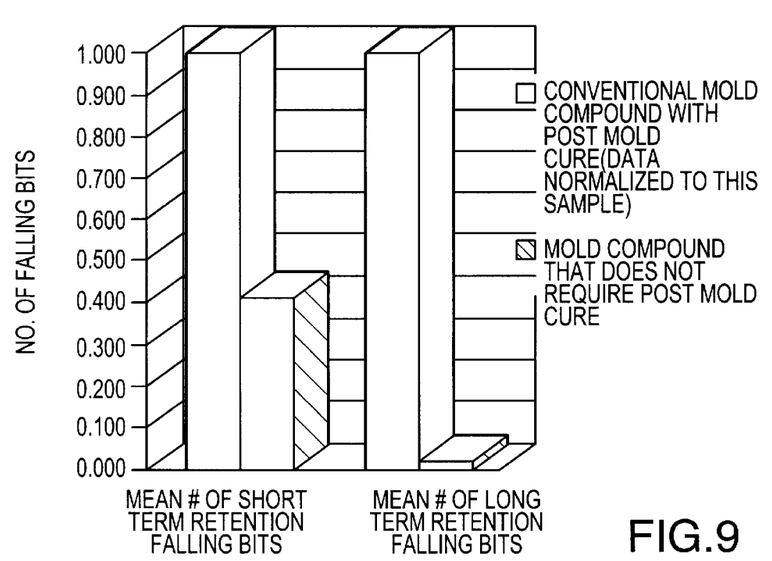
FIG. 9 is a "failed bits" chart for the mold compound step used in the method of the present invention.

Referring now to FIG. 9, the number of failing bits after the molding step due to failure of both short term and long term memory retention are shown. The number of failing bits for short term retention was reduced by a factor of 2.5, while the number of failing bits for long term retention was reduced by a factor of about 79.

As explained earlier, the marking steps in which the front and back surfaces of the plastic package are marked with symbols such as trademarks, identifying numerals and the like, can be a significant source of time at elevated temperature, and thus contributes to degradation of electrical performance in ferroelectric-based memories and integrated circuits. Accordingly, the method of the present invention offers three low temperature alternatives for marking: inking followed by an infrared cure; inking followed by an ultraviolet cure; and laser marking.

Heat-cure (infrared) marking can be used since it provides good contrast, exceptionally good mark permanency and overall good quality of marking. It is usable with various molding compounds, including the room temperature molding compound referred to above, without much variation in quality. Steps 38 and 44 shown in FIG. 3 are the back mark and front mark cure steps, respectively. After the package has been inked, the plastic package is "flash cured" by an infrared method at temperature ranges of between 150° C. and 250° C. for between 15 and 30 seconds. This is then followed by an oven cure at 145° C. to 155° C. for between 1.5 and two hours. The flash cure time and the subsequent oven cure can vary depending upon the exact specifications provided by the ink vendor. A suitable white ink is TPC261 manufactured by Teca-Print AG of Thayngen, Switzerland for use with the Teca TPX350 marking machine. Another example of a suitable infrared-curable ink is the Markem 4489 ink manufactured by the Markem Corporation of Keene, N.H.

An ultraviolet-cured marking can be used, although the quality and versatility may not be as good as with the infrared-cured inks. Steps 40 and 46 shown in FIG. 3 are alternative back mark and front mark cure steps, respectively. After the package has been inked, the plastic package is cured for about 13 to 20 seconds at about 150° C. to 180° C., with an ultraviolet light having an intensity of about 600 milliwatts per square centimeter. An example of a suitable ultraviolet-curable ink is the 4465 ink manufactured by the Markem Corporation.

Figure 10:
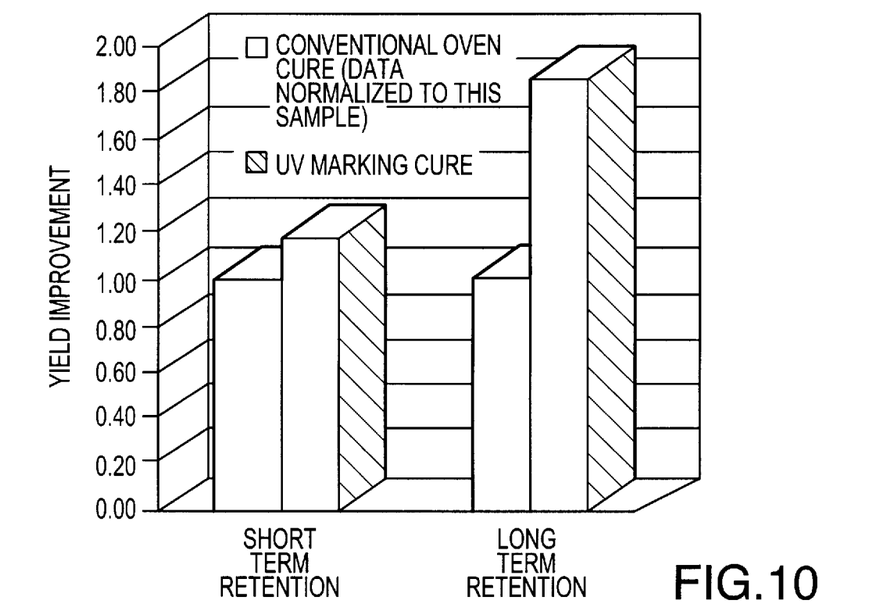
FIG. 10 is a yield improvement chart for the ultraviolet cure step used in the method of the present invention.

Referring now to FIG. 10, the yield improvement results after the ultraviolet curing steps 40 and 46 for both short term and long term memory retention are shown. Once again, short term memory retention only marginally improved over the prior art marking method, but long term retention improved by a factor of about 1.9.

Figure 11:
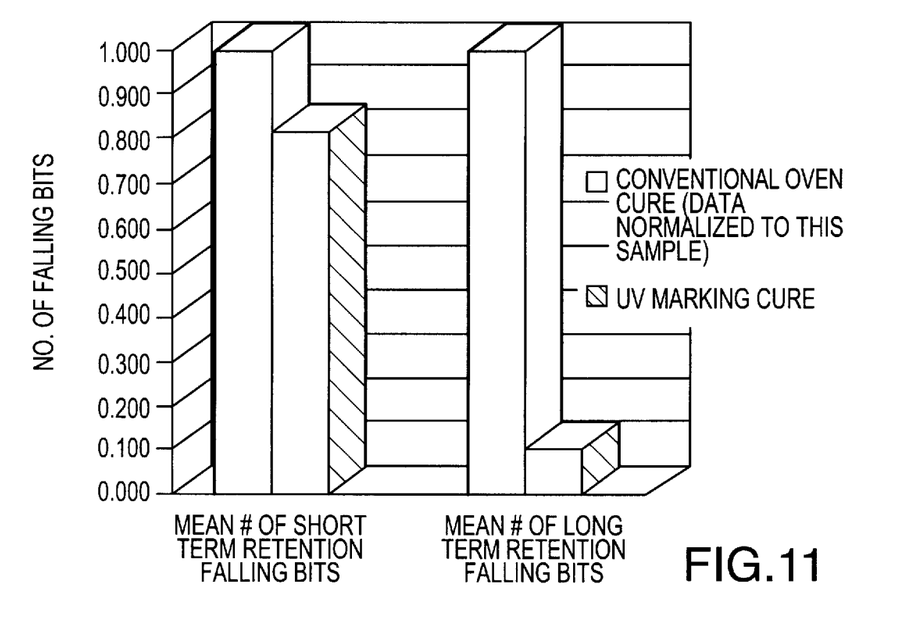
FIG. 11 is a "failed bits" chart for the ultraviolet cure step used in the method of the present invention.

Referring now to FIG. 11, the number of failing bits after the ultraviolet curing steps 40 and 46 due to failure of both short term and long term memory retention are shown. The number of failing bits for short term retention was reduced by a factor of about 1.2, while the number of failing bits for long term retention was reduced by a factor of about 10.

Laser marking can also be used, as referenced in steps 42 and 48 in FIG. 3. Laser marking is a highly stable and consistent marking process, although the initial capital investment may be greater than the ink marking steps referred to above. A YAG laser with about 90 watts of power can be used to perform the marking steps. A depth of about 0.7 mils is targeted and the duration of the laser marking is less than one second per unit marked.

Figure 12:
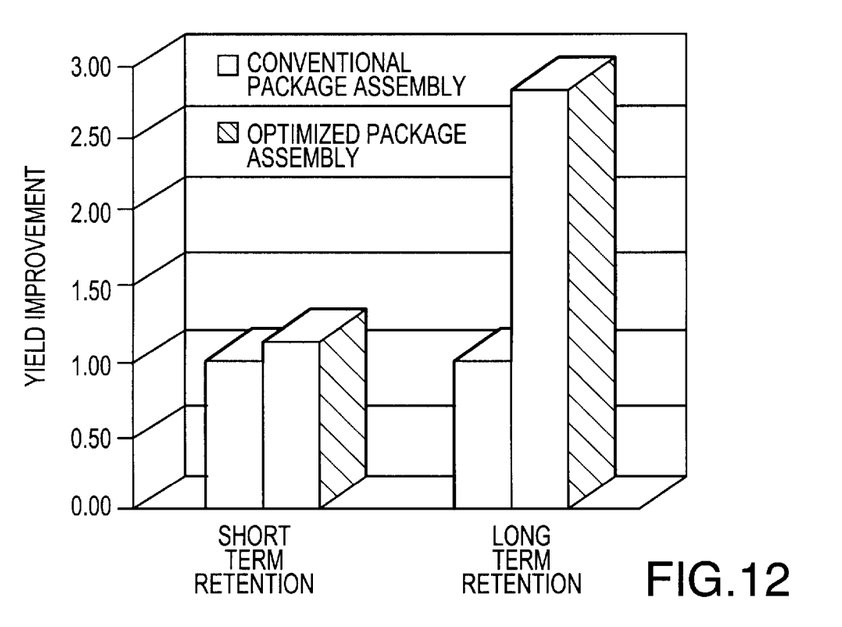
FIG. 12 is a yield improvement chart for the optimized package assembly method used in the method of the present invention.
Figure 13:
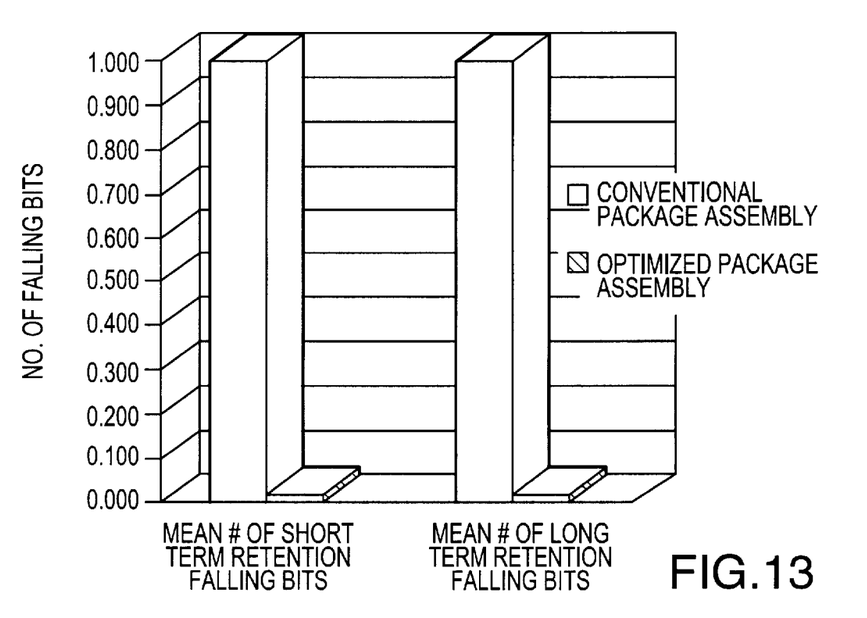
FIG. 13 is a "failed bits" chart for the optimized package assembly method used in the method of the present invention.

The results for the entire temperature-optimized assembly flow 30 of the present invention is shown with respect to FIGS. 12 and 13, using any of the three marking options. Significant yield improvements and reduction in failing bits were achieved due to the strict time-temperature budget required by the assembly method of the present invention.

Referring now to FIG. 12, the yield improvement results of the assembly method of the present invention for both short term and long term memory retention are shown. Short term memory retention improved overall by a factor of about 1.9 when compared to the conventional assembly method described above, and long term retention improved overall by a factor of about 2.8 when compared to the same conventional assembly method.

Referring now to FIG. 13, the number of failing bits of the entire assembly method of the present invention due to failure of both short term and long term memory retention are shown. The number of failing bits for short term retention was reduced by a factor of about 135 when compared to the conventional assembly method described above, while the number of failing bits for long term retention was reduced by a factor of about 113 when compared to the same conventional assembly method.

In conclusion, the plastic package assembly method of the present invention significantly improves both the yield and reliability of a ferroelectric-based integrated circuit such as a ferroelectric memory circuit when compared to the electrical performance of the same circuits when plastic-packaged using prior art techniques requiring extended times at elevated temperatures. In the method of the present invention, if infrared marking is used, the time at elevated temperatures above 145° C. is between about 1.5 and 2 hours. If either laser marking or ultraviolet-curable inks are used in marking, the time at the same elevated temperature can be reduced to three minutes or less.

Having described and illustrated the principle of the invention in a preferred embodiment thereof, it is appreciated by those having skill in the art that the invention can be modified in arrangement and detail without departing from such principles. For example, the exact times and temperatures of the key manufacturing steps described above can be altered as required. We therefore claim all modifications and variations coming within the spirit and scope of the following claims.

We claim:

1. A plastic package assembly method for significantly improving the yield and reliability of a ferroelectric-based integrated circuit comprising:

attaching the integrated circuit to a lead frame using a snap cure;

coating the integrated circuit;

curing the coated integrated circuit;

encapsulating the lead frame and attached, coated ferroelectric integrated circuit in a plastic package;

marking either or both of a front and back surface of the plastic package; and curing the marked surface of the plastic package, such that the total time the ferroelectric integrated circuit is exposed to a temperature of above 145° C. is at most two hours and the short term memory retention is improved by a factor of at least 1.9 when compared with a conventional assembly method involving more than two hours at a temperature above 145° C.

2. The plastic package assembly method of claim 1 in which the total time the integrated circuit is exposed to a temperature of above 145° C. is about 1.5 hours.

3. The plastic package assembly method of claim 1 in which the total time the integrated circuit is exposed to a temperature of above 145° C. is about three minutes.

4. A plastic package assembly method for significantly improving the yield and reliability of a ferroelectric-based integrated circuit comprising:

attaching the integrated circuit to a lead frame using a snap cure;

coating the integrated circuit;

curing the coated integrated circuit;

encapsulating the lead frame and attached, coated ferroelectric integrated circuit in a plastic package;

marking either or both of a front and back surface of the plastic package; and curing the marked surface of the plastic package, such that the total time the ferroelectric integrated circuit is exposed to a temperature of above 145° C. is at most two hours and the long term memory retention is improved by a factor of at least 2.8 when compared to a conventional assembly method involving more than two hours at a temperature above 145° C.

5. The plastic package assembly method of claim 4 in which the total time the integrated circuit is exposed to a temperature of above 145° C. is at most 1.5 hours.

6. The plastic package assembly method of claim 4 in which the total time the integrated circuit is exposed to a temperature of above 145° C. is about 3 minutes.

7. A plastic package assembly method for significantly improving the yield and reliability of a ferroelectric-based integrated circuit comprising:

attaching the integrated circuit to a lead frame using a snap cure;

coating the integrated circuit;

curing the coated integrated circuit;

encapsulating the lead frame and attached, coated ferroelectric integrated circuit in a plastic package;

marking either or both of a front and back surface of the plastic package; and curing the marked surface of the plastic package, such that the total time the ferroelectric integrated circuit is exposed to a temperature of above 145° C. is at most two hours and the number of failing bits is reduced by a factor of at least 135 for short term memory retention when compared to a conventional assembly method involving more than two hours at a temperature above 145° C.

8. The plastic package assembly method of claim 7 in which the total time the integrated circuit is exposed to a temperature of above 145° C. is at most 1.5 hours.

9. The plastic package assembly method of claim 7 in which the total time the integrated circuit is exposed to a temperature of above 145° C. is about 3 minutes.

10. A plastic package assembly method for significantly improving the yield and reliability of a ferroelectric-based integrated circuit comprising:

attaching the integrated circuit to a lead frame using a snap cure;

coating the integrated circuit;

curing the coated integrated circuit;

encapsulating the lead frame and attached, coated ferroelectric integrated circuit in a plastic package;

marking either or both of a front and back surface of the plastic package; and curing the marked surface of the plastic package, such that the total time the ferroelectric integrated circuit is exposed to a temperature of above 145° C. is at most two hours and the number of failing bits is reduced by a factor of at least 113 for long term memory retention when compared to a conventional assembly method involving more than two hours at a temperature above 145° C.

11. The plastic package assembly method of claim 10 in which the total time the integrated circuit is exposed to a temperature of above 145° C. is at most 1.5 hours.

12. The plastic package assembly method of claim 10 in which the total time the integrated circuit is exposed to a temperature of above 145° C. is about 3 minutes.

* * * * *